United States Patent [19]
Edwards

[11] Patent Number: 5,459,483
[45] Date of Patent: Oct. 17, 1995

[54] ELECTRONIC DEVICE WITH FEEDBACK LOOP

[75] Inventor: Martin J. Edwards, Crawley, Great Britain

[73] Assignee: U.S. Philips Corporation, New York, N.Y.

[21] Appl. No.: 275,055

[22] Filed: Jul. 13, 1994

[30] Foreign Application Priority Data

Jul. 16, 1993 [GB] United Kingdom .................. 9314849

[51] Int. Cl.$^6$ .................................................. G09G 3/36
[52] U.S. Cl. .............................. 345/98; 345/92; 345/100
[58] Field of Search ................................. 345/87, 90, 92, 345/93, 98, 100; 359/59

[56] References Cited

U.S. PATENT DOCUMENTS

| | | | |
|---|---|---|---|
| 4,429,305 | 1/1984 | Hosokawa et al. | 345/92 |
| 4,804,951 | 2/1989 | Yamashita et al. | 345/92 |
| 5,051,739 | 9/1991 | Hayashida et al. | 345/92 |

FOREIGN PATENT DOCUMENTS

| | | | |
|---|---|---|---|
| 0342925 | 11/1989 | European Pat. Off. | |
| 493820 | 7/1992 | European Pat. Off. | 345/92 |
| 0561462 | 9/1993 | European Pat. Off. | |

*Primary Examiner*—Ulysses Weldon
*Assistant Examiner*—Matthew Luu
*Attorney, Agent, or Firm*—John C. Fox

[57] ABSTRACT

Thin-film circuits comprising e.g. TFTs have inferior performance as compared with monolithic integrated circuits, and this inferior performance limits their use for e.g. drive circuits in large-area electronic devices such as an active matrix liquid-crystal display. In accordance with the invention, feedback with an external amplifier (150) is used to enhance the performance of a thin-film circuit. The feedback is taken from parallel nodes (40) of sequential stages (T1) of the circuit so that a common feedback line (51) and common external amplifier (150) can be used, thus reducing the number of substrate terminals and external connections required. Various buffers may be included between the feedback line (51) and the feedback terminal (56) to reduce the capacitive load on the line (51).

12 Claims, 3 Drawing Sheets

ELECTRONIC DEVICE WITH FEEDBACK LOOP

BACKGROUND OF THE INVENTION

This invention relates to electronic devices, for example an active-matrix liquid-crystal display or image sensor or a data store, comprising thin-film circuit elements which are connected together on a substrate to form a thin-film circuit, for example a drive circuit for a group of device cells. The present invention relates to improving the performance of the thin-film circuit.

Large-area active matrix devices were manufactured for many years with the device cells formed as thin-film circuit elements on an insulating substrate and with drive circuits formed as monolithic silicon integrated circuits. The monolithic drive circuits may be mounted on the periphery of the substrate or beside the substrate and required a large number of electrical connections to be made to thin-film circuit terminals on the substrate.

In more recent years drive circuits have been formed as thin-film circuit elements integrated on the same insulating substrate as the thin-film device cells. This thin-film integration of the drive circuit offers a number of advantages which include: a more compact device; a reduced complexity of electrical interconnection; and a possibility of reducing manufacturing cost. Thus, if the drive circuit is fabricated using thin-film circuit technology compatible with that used to make the active devices, then the drive circuit could in principle be produced on the device substrate at little or no additional cost (assuming that the integration does not significantly affect the yield of working devices).

Published European patent application EP-A-0 342 925 describes some examples of the integration of thin-film drive circuits on an active matrix device substrate, for example for a flat-panel liquid-crystal display. Thus, EP-A-0 342 925 describes both column and row drive circuits, each having an input terminal on the substrate for supplying an input signal to the drive circuit, and having a succession of parallel output stages which are coupled to the device cells and which serve sequentially to supply signals at respective parallel nodes of the output stages for driving the device cells. Both the column and row drive circuits of EP-A-0 342 925 comprise a shift register for sequentially addressing the output stages. The row drive circuit may include a buffer circuit at its outputs to the matrix. The column drive circuit includes sample-and-hold circuits at its outputs to the matrix.

However, thin-film drive circuits have inferior performance as compared with monolithic integrated circuits, because the thin-film circuit elements are formed with polycrystalline (or even amorphous) silicon as compared with the monocrystalline silicon with which conventional monolithic circuits are formed. Thus, a silicon thin-film transistor (TFT) generally has a smaller ON current, a larger OFF current and a slower switching speed as compared with a monolithic silicon field-effect transistor. TFTs often exhibit high threshold voltage and low mobility, and this makes it difficult to design high performance circuits with TFTs. These inferior characteristics are understood to result from a high density of trapping states for charge-carriers in the TFT thin film. EP-A-0 342 925 seeks to reduce the effect on performance by forming the drive circuit with complementary TFTs (i.e. both n channel and p channel TFTs) in some embodiments.

OBJECTS AND SUMMARY OF THE INVENTION

It is an aim of the present invention to provide a circuit means by which the performance of thin-film circuits can be significantly enhanced and so to permit the thin-film integration of high performance drive circuits on the thin-film circuit substrate of a flat-panel liquid-crystal display or other large area electronic device.

According to the present invention there is provided an electronic device comprising thin-film circuit elements which are connected together on a substrate to form a thin-film circuit having an input terminal and a succession of parallel output stages, which output stages serve sequentially to provide signals at respective parallel nodes of the output stages, characterised by the device also comprising a feedback loop from the parallel output stages to the input terminal, the feedback loop comprising a common feedback line which is coupled to the parallel nodes of the output stages, a feedback terminal which is present on the substrate and connected to the common feedback line, and a feedback amplifier which is connected between the feedback terminal and the input terminal, the feedback amplifier being external to the thin-film circuit elements on the substrate.

By providing such a feedback loop in accordance with the present invention the performance of the thin-film circuit can be enhanced. Many aspects of the circuit operation can be improved by this means, including immunity to variations in circuit element characteristics, improvements in the frequency response and switching behaviour and reduction of non-linearity effects. When the thin-film circuit produces weak signals, a degree of positive feedback of the signal from the respective parallel node may be employed to reinforce the signal as well as compensate for the poor performance of the thin-film circuit elements. Thus a positive feedback loop may be used to restore the signal level of a digital signal. However, a negative feedback loop is often more useful because it permits the subtraction of signal errors introduced by the thin-film circuit. A feature of circuits employing negative feedback is that they should have a high gain for the feedback to be effective. That gain can be provided in accordance with the invention by the feedback amplifier which is connected between the feedback terminal and the input terminal. Because that amplifier is external to the thin-film circuit elements on the substrate, it may be formed as a monolithic integrated circuit and so may have a high gain. The monolithic integrated circuit chip may be mounted on the substrate, or it may be mounted beside the substrate. By connecting the feedback amplifier to a common feedback line coupled to the parallel output stages which are sequential in operation, it is possible in accordance with the present invention to employ a single (i.e. common) amplifier and a single (i.e. common) feedback terminal to obtain the performance advantages of feedback, even though there may be a large number (e.g. several hundred) parallel output stages of the circuit. Thus, the present invention avoids needing to provide several hundred feedback paths and terminals from the substrate of a device having a large drive circuit, while providing performance enhancement for the several hundred output stages of this thin-film drive circuit.

Depending on the type of electronic device, the thin-film circuit may perform a variety of circuit functions. In forms which are at present of particular importance, the thin-film circuit may be a drive circuit for a group of device cells which are formed by thin-film circuit elements on the substrate. The device cells may be grouped in different ways and so the drive circuit configuration may also be of different types. In some devices, the device cells may form a single row or various types of linear array. However most commonly (for example, in flat-panel displays, area-image sensors and data stores) the cells may be grouped in rows and columns of a matrix. The invention is particularly advantageous for enhancing the performance of drive circuits having analog inputs and outputs, for example the video line column drive circuit of a flat-panel display. However, feedback in accordance with the present invention may be used to enhance the performance of digital output drive circuits, for example a column driver supplying data to a digital data store, or for example the row driver of an active matrix device.

By choosing which parts of any given thin-film circuit are included in the feedback loop, the performance of particular parts of the circuit can be enhanced. Thus, for example, the enhanced performance may be obtained for sampling TFTs in the parallel output stages of the drive circuit, and/or for buffer amplifiers in such parallel output stages.

The feedback amplifier which is external to the thin-film circuitry may be a differential amplifier. An external input signal may be fed to one terminal of such a differential amplifier for input to the thin-film circuit after modification by the signal fed back from the output stages. However such an external input signal may be fed via a thin-film common buffer circuit on the substrate to the external differential amplifier. In another form, the external feedback amplifier has a single input fed from a thin-film differential buffer circuit on the substrate.

Furthermore, the invention permits the inclusion of various thin-film buffers and switches in different circuit configurations on the device substrate so as to isolate the effects of various common capacitances which may otherwise slow down the device operation.

BRIEF DESCRIPTION OF THE DRAWINGS

These and other features in accordance with the invention, and their advantages, are illustrated specifically in embodiments of the invention now to be described, by way of example, with reference to the accompanying drawings, in which:

It should be noted that the FIG. 1 layout is only diagrammatic and not drawn to scale, and that only a small number of its device cells are illustrated for the sake of clarity and convenience in the drawing. In FIGS. 2 and 3, the device cells (29,30) on each column line (26) are simply depicted by a load capacitor C, for convenience in the drawing; and FIG. 3 merely shows the column drive circuit for one such column line (26), it being understood that a large number of such column drive circuits are similarly connected between the common supply line (14) and common feed-back line (51) of the device. Furthermore FIGS. 4 to 6 merely show the common thin-film buffer circuit and external amplifier which are connected to the common supply line (14) and common feed-back line (51), between which a large number of such column drive circuits are present. In the different embodiments shown in the drawings, the same reference signs are generally used to refer to corresponding or similar features.

DESCRIPTION OF THE PREFERRED EMBODIMENT

Figure 1:
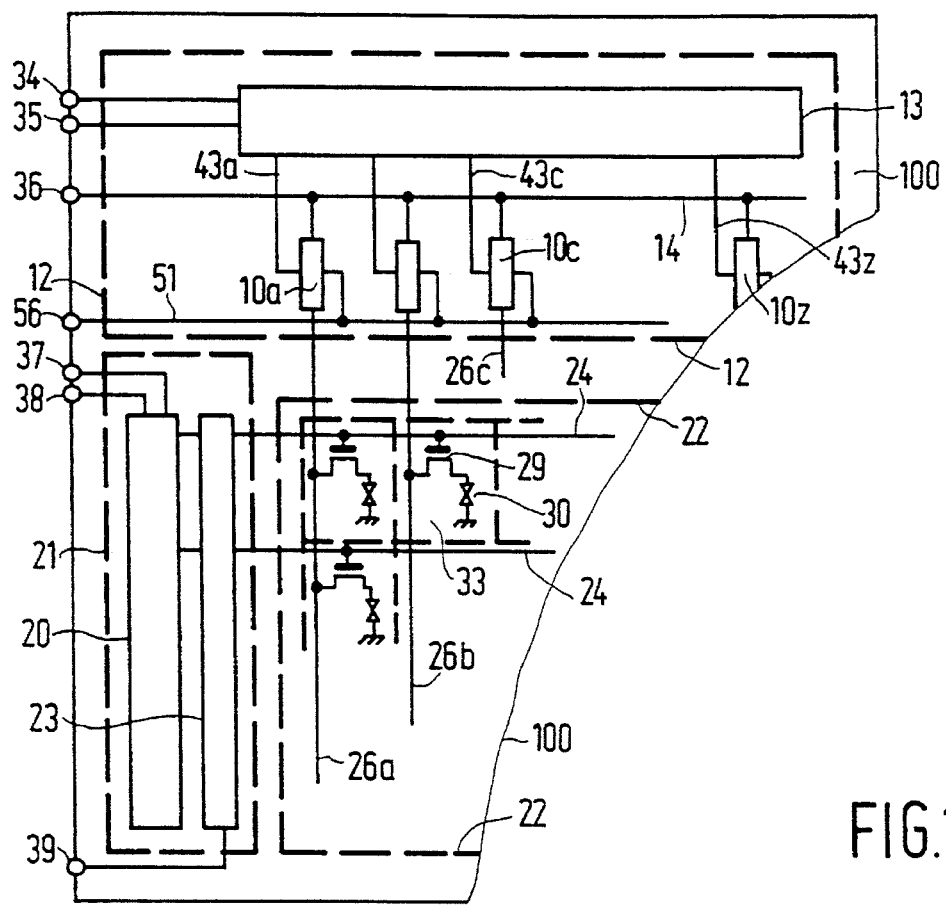
FIG. 1 is a circuit block diagram of an example of a thin-film circuit substrate of an electronic device in accordance with the invention, without showing its external feedback amplifier(s)

Apart from the provision of feedback to enhance thin-film circuit performance in accordance with the present invention, the electronic device of FIG. 1 may be of known type and known construction, e.g. a flat panel display. The device comprises thin-film circuit elements which are connected together on an insulating substrate 100 to form a matrix 22 of device cells 33, a row drive circuit 21 and a column drive circuit 12. The matrix 22 of cells 33 is organised in rows and columns on the substrate 100 (e.g. a glass back panel of the display). The row drive circuit 21 has a succession of thin-film parallel output lines 24 connected to the device cells 33 for sequentially addressing rows of the matrix 22. The column drive circuit 12 has a succession of thin-film parallel output lines 26 connected to the cells 3 for supplying sampled video signals for sequentially driving the cells. A shift register 13 of the circuit 12 addresses sequentially a succession of parallel output stages 10. Each stage 10 comprises a TFT sampling transistor T1 (see FIGS. 2 and 3) and provides at a node 40 (see FIGS. 2 and 3) a sampled output signal for the respective output line 26 from a common signal line 14.

In order to enhance the performance of the output stages 10 in accordance with the present invention, the device of FIG. 1 comprises a negative feedback loop from the parallel output stages 10 to an input terminal 36 of the column drive circuit 12. This negative feedback loop comprises a common feedback line 51 which is coupled to the parallel nodes 40 of the output stages 10, a feedback terminal 56 which is on the substrate 100 and connected to the feedback line 51, and a feedback amplifier 150 (see FIGS. 2 to 5) which is connected between the feedback terminal 56 and the input terminal 36 of the drive circuit 12. The feedback amplifier 150 is external to the thin-film circuitry on the substrate 100 and so is not shown in FIG. 1. This amplifier 150 is most conveniently provided as a monolithic integrated circuit formed conventionally as a monocrystalline silicon chip. The amplifier 150 may be mounted on a support or circuit-board beside the substrate 100 and may be connected to the substrate terminals 36 and 56 in known manner by connection wires or by a conductor pattern on a flexible foil. Alternatively, the amplifier 150 may be mounted as a naked chip on a peripheral area of the substrate 100, for example by flip-chip mounting on the terminals 36 and 56 to form direct electrical connections or by mounting on the substrate area between these terminals 36 and 56 and using connection wires.

Apart from the provision of negative feedback from the parallel output stages 10 of the column drive circuit 12 in accordance with the present invention, the device of FIG. 1 may be similar to the active matrix display panel of FIG. 1 of EP-A-0 342 925 as a particular example. Thus, the present FIG. 1 is based on FIG. 1 of EP-A-0 342 925, and the features for which the same reference signs are used as in FIG. 1 of EP-A-0 342 925 may be the same as or similar to those of EP-A-0 342 925. Thus, for example the circuit blocks 13,20 and 23 may be formed with complementary p channel and n channel TFTs, or they may be formed entirely with n channel TFTs. The whole contents of EP-A-0 342 925 are hereby incorporated herein as reference material.

This display panel embodiment of the device of FIG. 1 for the present invention will therefore not be described in detail. An analog video signal is fed to the input terminal 36 of the column drive circuit 12 in operation of the display and is sampled by the TFT switching transistors TI, see FIG. 2. The feedback amplifier 150 has an analog-signal input 152 for the video signal to the device and provides an amplified analog-signal output 155 to the input terminal 36, see FIG. 2. The display panel embodiment of FIG. 1 is a monochrome display having a single video input terminal 36. Although TFTs are the switching elements 29 illustrated in the individual display cells of FIG. 1 and in EP-A-0 342 925, it should be understood that other types of switching element 29 may be used in a display or other electronic device in accordance with the invention, for example thin-film diodes as described in European patent application EP-A-0 561 462 published on 22nd Sep. 1993 (our reference PHB33784).

Figure 2:
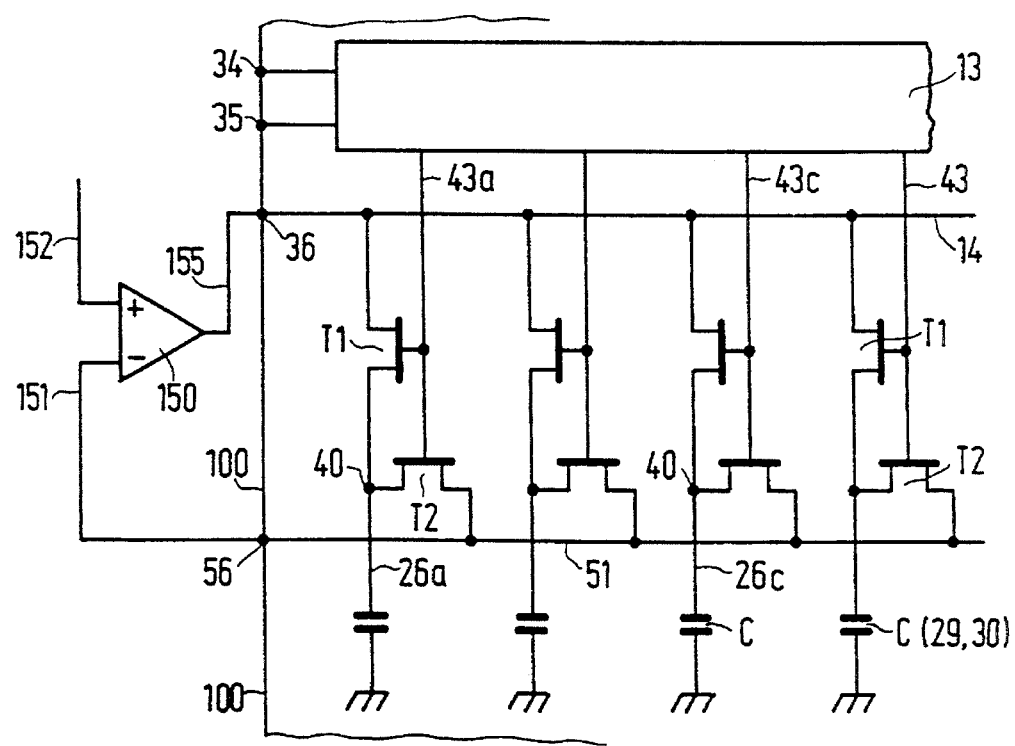
FIG. 2 is a circuit diagram of feedback in accordance with the invention from one example of parallel output stages of the column drive circuit of the device of FIG. 1.

FIG. 2 illustrates the use of negative feedback to enhance the performance of one particular example of a parallel output stage 10, using an external high-gain differential amplifier 150. Each output stage 10 consists of a sampling transistor T1 and an associated feedback coupling transistor T2. Both these transistors T1 and T2 may be n channel enhancement-mode TFTs. The sampling TFT T1 serves to take an input signal from the common signal line 14 and to provide an output signal at node 40 for a respective one of the parallel output lines 26. The associated coupling TFT T2 serves to couple the respective node 40 of the parallel output line 26 to the common feedback line 51. Each parallel shift output 43 of the shift register 13 in the FIG. 2 embodiment is coupled to the gates of the sampling and coupling TFTs T1 and T2 of the respective output stage 10 so that successive output stages 10 are switched on sequentially.

Thus, in a display device, the video signal is fed to the non-inverting input 152 of the differential amplifier 150. The output 155 of the amplifier 150 is connected to the common input line 14 of the switching TFTs TI. In known manner, these transistors T1, together with a storage capacitance C for their respective column line 26, perform a sample and hold function for the video signal to be applied to a display cell of that column. The capacitance C shown in FIG. 2 may include (as well as its column cells 29,30) a discrete storage capacitor Cs in the output circuit 10, or the capacitance of the line 26 itself and of its cells 29,30 may provide the whole of the charge-storage means C for the sampled video signal. By means of the coupling TFT T2, the voltage on the column line 26 (corresponding to the sampled video signal held in the capacitor C) is coupled from the node 40 to the common feedback line 51, and so this voltage signal is fed back to the inverting input 151 of the differential amplifier. A common feedback loop 51,56,150,36 and 14, can be used in accordance with the invention because only one output stage 10 of the circuit 12 is sampling the video signal on line 14 at any given time, due to tile sequential switching of the output stages 10. The negative feedback acts in such a way that, when one of the stages 10 is turned on, the external amplifier 150 produces an output signal which will charge the column voltage for that one stage 10 to the same level as the video input signal.

An advantage of applying negative feedback in the circuit of FIG. 2 is that it allows the effective impedance of the switching TFTs T1 to be reduced, so that the column capacitance C can be charged more rapidly and/or a smaller switching device T1 can be used. A measure of the effect of the feedback can be obtained by considering a situation where T1 is represented by a resistor of value R. Applying negative feedback (via the components T2, 51 and 150 as in FIG. 2) reduces the effective value of the resistor to approximately R/A, where A is the gain of the amplifier 150. This reduction arises because the output signal of the amplifier 150 can be larger than the level of the video signal, and so the feedback circuit can provide a higher transient charging current for a given value of C. In practice, the resistance of a transistor is highly voltage dependent and so cannot be fully represented as a resistor R. As a result of this dependence, together with the limited output voltage range achievable from an amplifier 150, the reduction in the effective resistance of the TFT T1 that can be achieved in practice is somewhat less than the factor 1/A. In this particular example, the main advantage of using feedback in accordance with the invention is a reduction in the column charging times.

Figure 3:
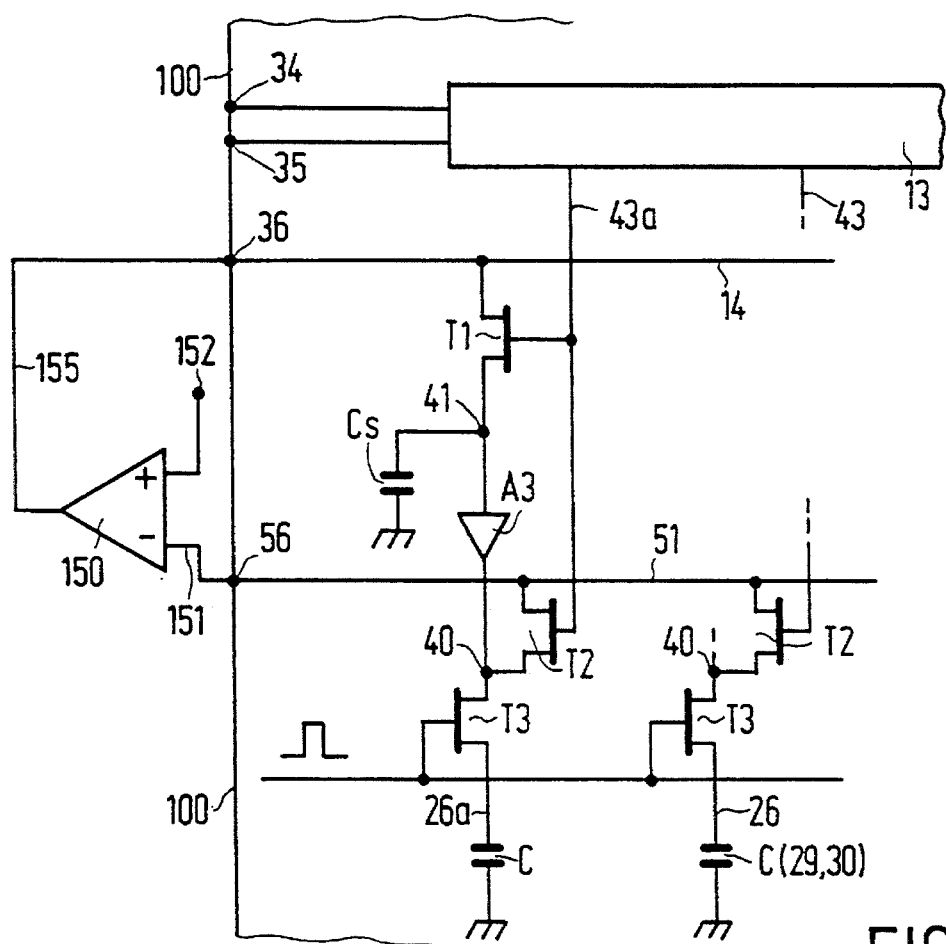
FIG. 3 is a circuit diagram of feedback in accordance with the invention from a variant of the parallel output stages of FIG. 2, each having a buffer amplifier.

FIG. 3 illustrates a different situation in which each output stage 10 also comprises a buffer amplifier A3 for driving a large capacitance on the respective output line 26. The buffer A3 comprises a TFT amplifier circuit. The output from this buffer amplifier A3 at node 40 is fed back via the common feedback line 51 by means of the coupling TFT 2 of that output stage 10. In this example, each output stage comprises a signal storage means in the form of a discrete storage capacitor Cs at the output of TFT T1; the buffer amplifier A3 is connected between the output line 26 and the output of TFT TI and capacitor Cs. The buffer A3 may be coupled to the column line 26 by a series output switch in the form of a TFT T3. Whereas the column lines 26 of the FIG. 2 circuit are driven sequentially, the provision of the output switches T3 permit the column lines 26 of the FIG. 3 circuit to be driven in parallel, by simultaneously transferring the sampled video signals to the lines 26 in parallel. Furthermore, this output switch T3 removes the capacitive load C from the buffer amplifier A3 during feedback, and so the feedback can be isolated from the column capacitance. Such an output switch T3 may also be incorporated in a variant of the FIG. 2 circuit having a signal storage means Cs in each output stage 10.

In the FIG. 3 situation, the provision of negative feedback in accordance with the invention can compensate for limitation in the performance of the buffers A3, for example for non-linearities or offset voltages or variations in the buffer characteristics. In this manner the feedback facilitates the transfer of correct voltage values onto the lines 26 from the sampling of the video input waveform on the line 14.

Figure 4:
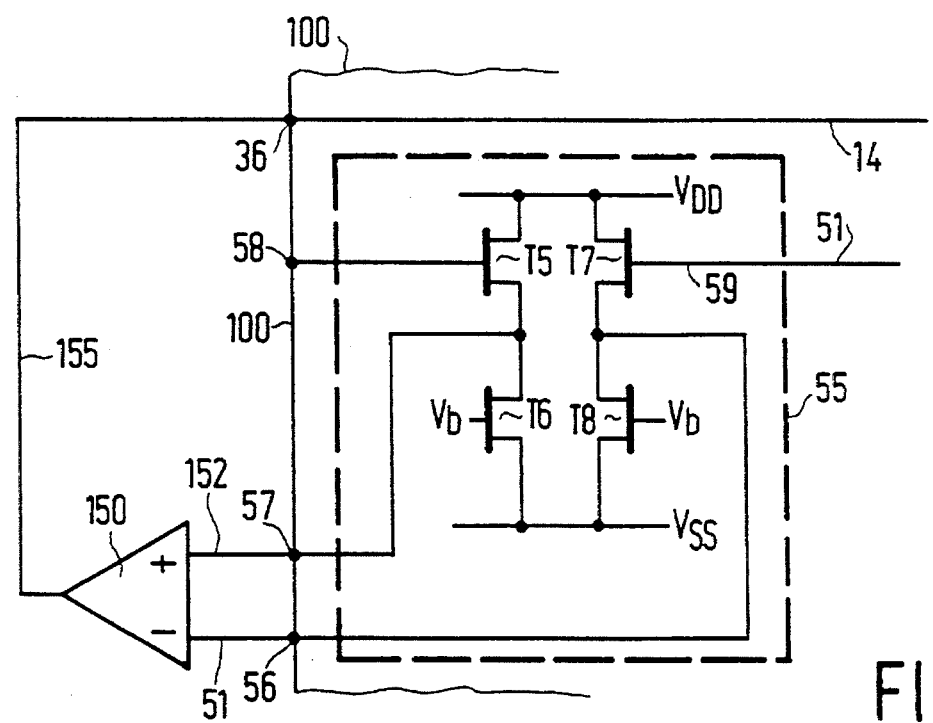
FIGS. 4 to 6 are circuit diagrams of feedback in accordance with the invention via three different common buffer circuits in variants of the FIG. 2 or FIG. 3 circuit.

FIG. 4 illustrates a situation in which the common feedback line 50 is connected to the feedback amplifier 150 by a common buffer circuit 55 for the negative feedback loop. The buffer circuit 55 has a single input 58 for the input signal (which is to be supplied to the external amplifier 150), an input 59 from the feedback line 51, and first and second outputs 56 and 57 to the respective inputs 151 and 152 of the differential amplifier 150. The output section of the buffer circuit 55 comprises two TFTs T7 and T8 connected in a source follower configuration. The feedback line 51 is connected to the gate of T7, whereas the gate of T8 is held at a fixed bias potential Vb. The provision of a common output buffer on the line 51 can improve the dynamic characteristics of the circuit, by isolating the feedback line 51 from the capacitance of the input connection 151 to the amplifier 150. Thus, in the absence of this feedback buffer, the total capacitance of the feedback line 51 and the amplifier connection 151 may be so large that the voltage on the feedback line 51 may no longer follow the voltage on the column lines 26. This feedback buffer circuit introduces an offset in the signal fed back to the amplifier 150. A similar offset in the input signal may be obtained by including a similar input section of the buffer circuit 55, i.e. two TFTs T5 and T6 connected in a source follower configuration in the specific example of FIG. 4.

Figure 5:
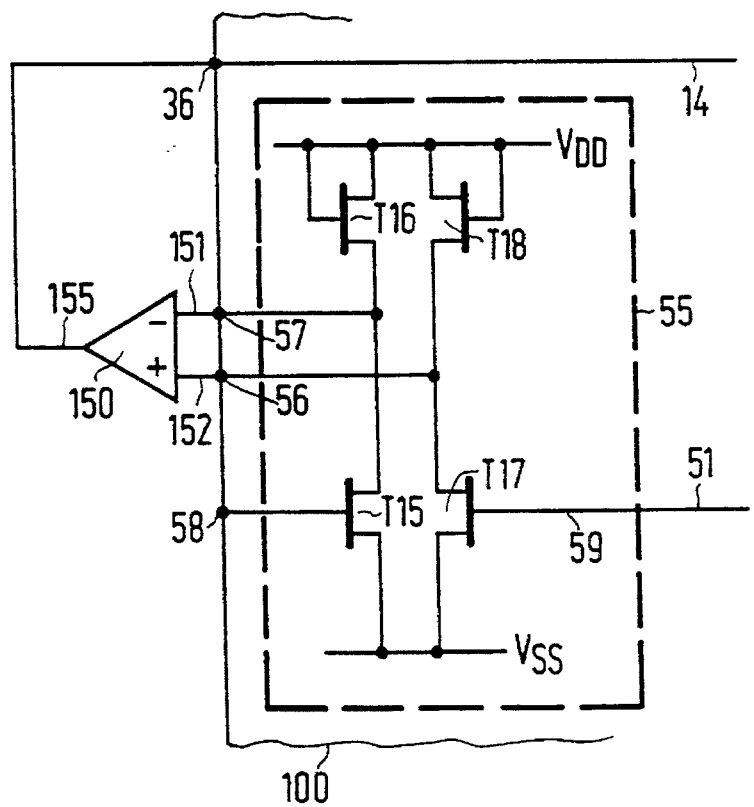

FIG. 5 illustrates a variant of the FIG. 4 common buffer circuit 55, in which transistor pairs (TI5 and T16) and (T17 and T18) are connected in an inverter configuration in the input and output sections. The input section of the buffer circuit 55 comprises a TFT T15 with a load T16, whereas the output section comprises a TFT T17 with a load Ti8. Because of the invertor function of this buffer circuit 55 of FIG. 5, the feedback terminal 56 is now connected to the non-inverting input 152 of the amplifier 150 and the input signal is fed to the inverting input 151 of the amplifier 150.

Figure 6:
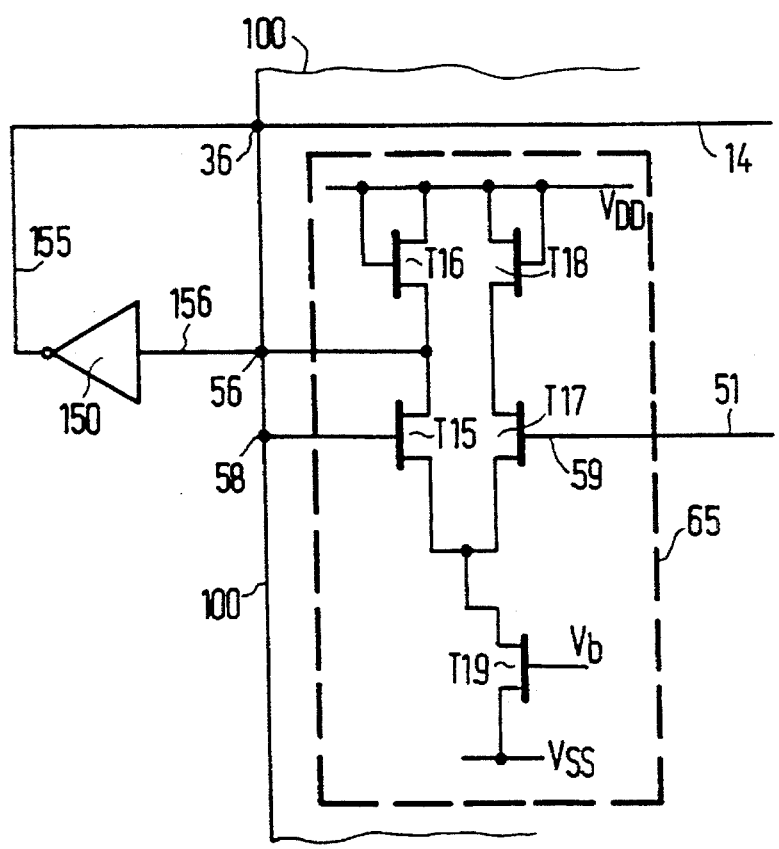

In the circuits of FIGS. 1 to 5, the external amplifier 150 is a differential amplifier having a first input for an external input signal and a second input from the feedback terminal 56 on the substrate 100, one of these inputs being inverting. This differential amplifier 150 has a single output 155 connected to the input terminal 36 on the substrate 100. FIG. 6 illustrates a different situation in which the amplifier 150 has only a single input 156 and provides an inverted but amplified output. The differential function is now performed in a thin-film buffer circuit 65 on the substrate 100. In this case, the differential buffer circuit has a signal input 58 and an input 59 from the feedback line 51 and provides a single output to the feedback terminal 56. Terminal 56 is connected to the input 156 of the external high gain feedback amplifier 150. The differential buffer circuit 65 may comprise a long-tail pair of TFTs TI5 to T19. The gate of TFT T19 is held at a fixed bias potential Vb and so T19 acts as a constant current source whose current is shared between the two arms (T15 and TI6) and (T17 and T18); thus, the signals applied to the gate of TFT T17 via the feedback line 51 and applied to the gate of TFT T15 via the input 58 result in a differential output at the feedback terminal 56 of the substrate 100. An advantage of using a differential buffer circuit 65 is that no substrate terminal 57 is required, and a simpler amplifier 150 may be used.

Many other variations and modifications are possible in devices in accordance with the present invention. In FIG. 1, only one feedback line 51 is shown for all the parallel output stages 10 of the drive circuit 12. FIGS. 4 to 6 illustrate how the capacitive load on the feedback line 51 can be reduced by inclusion of a common buffer circuit 55 or 65. It is also possible to avoid excessive loads on a common feedback line 51 by using more than one feedback line 51 for a drive circuit 12 having a large number of output stages 10. Thus, for example, the output stages 10a, 10c etc. in the left-hand half of the circuit 12 of FIG. 1 may be connected to one common feedback line 51 as illustrated in FIG. 1, whereas the output stages 10z etc. in the right-hand half of the circuit 12 of FIG. 1 may be connected to a second feedback amplifier 150 by a second common feedback line 51. Thus, these second output stages 10z etc. may be connected between the second feedback line 51 and a second common signal line 14 which is fed by the second amplifier 150. These second lines 14 and 51 have their own respective substrate terminals 36 and 56.

FIG. 1 shows a single video input terminal 36 for a monochrome display. However, the device of FIG. 1 may be a colour display having three input terminals 36 and three respective signal lines 14 for R,G, and B video signals as in the display of FIG. 1 of EP-A-0 342 925. In this case the output stages 10 are organised in groups of three, as illustrated in EP-A-0 342 925; three feed-back lines 51 (each with a respective feedback terminal 56 and respective amplifier 150) are then provided in accordance with the present invention, so as to provide separate negative feedback loops for each of the three video signals R,G and B.

FIGS. 1 to 6 illustrate the use of feedback in accordance with the present invention for the column drive circuit 12 of an active matrix device. However, such feedback may be used in accordance with the present invention to enhance the performance of a row drive circuit of such a matrix device. Thus, in the device of FIG. 1, the row drive circuit 21 comprises a row driver buffer circuit 23 having an input terminal 39. A feedback loop (comprising coupling transistors T2, a feedback line 51, a feedback terminal 56 and an external differential amplifier 150) may be connected between the parallel row lines 24 and the input terminal 39 of the row buffer circuit 23 so as to provide negative feedback for performance enhancement. Because each row output line 24 is selected in turn to address the matrix, only one output line 24 is active at any given time. Thus, a common feedback line 51 can be coupled to all these parallel output lines 24.

In the embodiments of FIGS. 2 and 3, the feedback is from the outputs of stages 10 of the drive circuit. However, depending on the circuit design it could also be appropriate to feedback intermediate signals from within the drive circuits rather than those actually present on the column and/or row lines 26 and 24 of the cell matrix 22. Thus, for example, in the circuit of FIG. 3 the feedback may be taken by a coupling transistor T2 from node 41 at the input of the buffer amplifier A3 (instead of from node 40 at the output of the buffer amplifier A3); in this case, the feedback can serve to increase the speed of the sampling transistor T1 of the output stages of FIG. 3.

As mentioned above the active matrix device of FIG. 1 may be a flat-panel display. Instead of being a flat panel display, a matrix device in accordance with the invention may be designed for a quite different function, for example a data store having a matrix of thin-film switching elements 29 for addressing an array of thin-film data storage elements (for example thin-film capacitors). Either analog or digital signals may be fed to such a data store from a signal line 14 via the parallel output stages 10. In another form, an electronic device in accordance with the invention may be an image sensor having a matrix 22 of cells 33 each comprising a thin-film sensing element 30 (for example a photodiode) addressed by a thin-film switching element 29 via row lines 24. In this case, the photodiode signal may be output to a thin-film sensing circuit (12) having parallel output stages (10) which act as integrators for the signal and provide sequential parallel outputs to a common output line (14). In order to improve the performance of the TFT peripheral circuits Ig and 21 of such a data store or image sensor, an external feedback amplifier 150 may be connected via a terminal 56, a common feedback line 51 and coupling TFTs to these parallel output stages of the circuits 12 and/or 21.

In the embodiments of FIGS. 1 to 3, the output stages 10 are addressed sequentially by outputs 43 of a shift register. However, instead of shift register, a multiplexer circuit may be used to sequentially address these output stages 10.

As described above, the external amplifier 150 may be a monolithic integrated circuit formed in a monocrystalline silicon chip. However, instead of a monocrystalline silicon circuit, a gallium arsenide monolithic integrated circuit may be used. Furthermore, in the case of a simple amplifier 150, instead of an integrated circuit, the amplifier 150 may be formed as a hybrid circuit with discrete monocrystalline silicon transistors, for example.

In the buffer circuits 55 and 65 of FIGS. 4 to 6 a similar offset in the input signal (to the offset in the feedback signal) is obtained by having a similar circuit configuration for the input section as for the output (feedback) section. However, a similar offset may be achieved by circuit design with a different circuit configuration, and the output (feedback) section can be designed to minimise the offset.

From reading the present disclosure, other variations and modifications will be apparent to persons skilled in the art. Such variations and modifications may involve equivalents and other features which are already known in the design, manufacture and use of feed-back circuits and of electronic devices with thin-film circuitry and component parts thereof, and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

I claim:

1. An electronic device comprising:
   (a) a thin-film circuit on a substrate, the thin film circuit having an input terminal (36), a succession of parallel output stages (10), the output stages each comprising a sampling transistor switch (T1), the circuit further comprising a common signal line (14) connecting the input terminal (36) to the input side of the sampling transistor switches (T1), parallel nodes (40) connected to the output side of the sampling transistor switches (T1), a feedback terminal (56), a common feedback line (51) coupling the nodes (40) to the feedback terminal (56), and parallel output lines (26) connected to the nodes (40); and
   (b) a feedback amplifier (150) having a first input (151), a second input (152), and an output (155), the feedback terminal (56) connected to the first input (151), an input signal source connected to the second input (152), and output (155) connected to the input terminal (36);
   (c) the parallel output stages (10) each forming a feedback loop with the feedback amplifier (150), whereby in operation the input signal is sampled by the parallel output stages to produced signal samples, and the samples are fed to the feedback amplifier for correction, and the corrected samples are fed back to the output stages and thence to the parallel output lines, whereby performance of the thin film circuit is enhanced.

2. A device as claimed in claim 1, in which each parallel output stage further comprises a coupling transistor switch, the coupling transistor switch serving to couple the respective parallel node to the common feedback line.

3. A device as claimed in claim 2, in which each output stage (10) also comprises a buffer amplifier (A3) between the sampling transistor switch (T1) and the respective parallel node (40), an output signal from the buffer amplifier (A3) being fed back via the common feedback line (51).

4. A device as claimed in claim 2 in which the thin-film circuit comprises a shift register having a succession of parallel shift outputs to the parallel output stages, each parallel shift output being coupled to gates of the sampling and coupling transistor switches of the respective output stage.

5. A device as claimed in claim 1, in which each parallel output stage comprises a signal storage means (Cs) and an output switch (T3) is present between the respective parallel node (40) and an output line (26) of that output stage.

6. A device as claimed in claim 1, in which a common buffer circuit for the negative feedback loop is formed by thin-film circuit elements on the substrate, which common buffer circuit has an input from the feedback line and an output to the feedback terminal.

7. A device as claimed in claim 1, in which the feedback amplifier is a differential amplifier which has a first input for an input signal and a second input from the feedback terminal on the substrate and which has an output connected to the input terminal on the substrate.

8. A device as claimed in claim 1, in which the common feedback line is connected to the feedback amplifier by a differential buffer circuit formed by thin-film circuit elements on the substrate, which differential buffer circuit has a signal input for an input signal, an input from the feedback line, and a single output to the feedback terminal, the feedback amplifier having a single input which is connected to the feedback terminal.

9. A device as claimed in claim 1, in which the feedback amplifier is a monolithic integrated circuit.

10. A device as claimed in claim 1, in which the thin-film circuit is a drive circuit for a group of device cells which are formed by thin-film circuit elements on the substrate, the parallel output stages being coupled to the device cells for driving the device cells in operation of the device.

11. A device as claimed in claim 10, in which the device is a flat panel display, the drive circuit is a column driver of the display, and an analog video signal is fed to the input terminal via the feedback amplifier in operation of the display.

12. A device as claimed in claim 3, further in which the thin-film circuit comprises a shift register having a succession of parallel shift outputs to the parallel output stages, each parallel shift output being coupled to gates of the sampling and coupling transistors of the respective output stage.

\* \* \* \* \*